US012738323B2

(12) United States Patent
Markov et al.

(10) Patent No.: US 12,738,323 B2
(45) Date of Patent: Sep. 15, 2026

(54) PROGRAMMING METHOD FOR NON-VOLATILE MEMORY CELLS

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 106 days.

(21) Appl. No.: 19/031,281

(22) Filed: Jan. 17, 2025

(65) Prior Publication Data

US 2026/0128101 A1 May 7, 2026

Related U.S. Application Data

(60) Provisional application No. 63/717,847, filed on Nov. 7, 2024.

(51) Int. Cl.
*G11C 16/10* (2006.01)
*G11C 16/14* (2006.01)
*G11C 16/26* (2006.01)

(52) U.S. Cl.
CPC ............ *G11C 16/102* (2013.01); *G11C 16/14* (2013.01); *G11C 16/26* (2013.01)

(58) Field of Classification Search
CPC .............................. G11C 16/102; G11C 16/10
USPC ..................................................... 365/189.11
See application file for complete search history.

(56) References Cited

U.S. PATENT DOCUMENTS

| | | | |
|---|---|---|---|
| 5,029,130 | A | 7/1991 | Yeh |
| 6,747,310 | B2 | 6/2004 | Fan |
| 6,855,980 | B2 | 2/2005 | Wang et al. |
| 6,992,929 | B2 | 1/2006 | Chen |
| 7,315,056 | B2 | 1/2008 | Klinger |
| 7,868,375 | B2 | 1/2011 | Liu et al. |
| 8,711,636 | B2 | 4/2014 | Do et al. |
| 9,245,638 | B2 | 1/2016 | Do |
| 10,838,652 | B2 | 11/2020 | Markov |
| 2005/0083735 | A1 | 4/2005 | Chen |

(Continued)

OTHER PUBLICATIONS

PCT Search Report and Written Opinion mailed on Jul. 25, 2025 corresponding to the related PCT Patent Application No. PCT/US2025/012824.

*Primary Examiner* — Muna A Techane
(74) *Attorney, Agent, or Firm* — DLA Piper LLP (US)

(57) ABSTRACT

A method of programming a memory cell to a target program state associated with a target read current, comprising applying a first pulse of programming voltages that includes a first control gate voltage, applying a second pulse of programming voltages that includes a second control gate voltage, performing a read operation that includes detecting currents through the memory cell for different voltages applied to the control gate, determining a first read voltage for the control gate using the detected currents that corresponds to the target read current, determining a target programming voltage using the second voltage, the first read voltage, a control gate nominal read voltage and a tuning factor, erasing the memory cell, applying a third pulse of programming voltages that includes the first control gate voltage, and applying a fourth pulse of programming voltages that includes the target programming voltage applied to the control gate.

22 Claims, 4 Drawing Sheets

(56) References Cited

U.S. PATENT DOCUMENTS

2011/0255343 A1 10/2011 Moschiano
2012/0113714 A1 5/2012 Choy
2020/0065023 A1* 2/2020 Markov ............. G11C 16/0425
2020/0066738 A1* 2/2020 Tkachev ............ G11C 16/0408
2020/0234758 A1* 7/2020 Tran ..................... G06N 3/0464

* cited by examiner

PROGRAMMING METHOD FOR NON-VOLATILE MEMORY CELLS

RELATED APPLICATIONS

This application claims the benefit of U.S. Provisional Application No. 63/717,847, filed Nov. 7, 2024, and which is incorporated herein by reference.

FIELD OF THE INVENTION

The present disclosure relates to non-volatile memory cells of semiconductor devices, and more particularly to a technique of programming memory cells.

BACKGROUND OF THE INVENTION

Split-gate non-volatile memory semiconductor devices are well known in the art. See for example U.S. Pat. No. 7,868,375, which discloses a four-gate memory cell configuration, and which is incorporated herein by reference for all purposes. Specifically, FIG. 1 of the present disclosure illustrates a pair of split gate non-volatile memory cells 10 each with spaced apart source and drain regions 14/16 formed in a silicon semiconductor substrate 12. The source region 14 can be referred to as a source line SL (because it commonly is connected to other source regions for other non-volatile memory cells 10 in the same row or column), and the drain region 16 is commonly connected to a bit line. A channel region 18 of the substrate 12 extends between the source/drain regions 14/16. A floating gate 20 is disposed over (i.e., vertically over and laterally overlapping) and insulated from (and directly controls the conductivity of) a first portion of the channel region 18 (and partially over, and insulated from, the source region 14). A control gate 22 is disposed over, and insulated from, the floating gate 20. A select gate 24 (also referred to as a word line gate) is disposed over, and insulated from, and directly controls the conductivity of, a second portion of the channel region 18. An erase gate 26 is disposed over and insulated from the source region 14 and is laterally adjacent to the floating gate 20. The erase gate 26 can include a notch that faces an edge of the floating gate 20.

A plurality of such memory cells 10 can be arranged in rows and columns to form a memory cell array, as illustrated in FIG. 2. While FIG. 1 only shows a pair of memory cells 10 (sharing a common source region 14 and erase gate 26), the memory cell pairs can be placed end to end to form a column of memory cells 10 (where the memory cell pairs can share a common drain region 16). While only two such columns are shown in FIG. 2, there can be many such columns. Each column can include a bit line 16*a* electrically connecting together all the drain regions 16 in the column. Each row of memory cells 10 can include a control gate line 22*a* electrically connecting together all the control gates 22 in the row of memory cells 10. For example, all the control gates 22 in each row of memory cells 10 can be formed as a continuous line of conductive material, where a portion of the continuous line passing through any given memory cell 10 serves as its control gate 22. Each row of memory cells 10 can include a select gate line 24*a* electrically connecting together all the select gates 24 in the row of memory cells 10. For example, all the select gates 24 in each row of memory cells 10 can be formed as a continuous line of conductive material, where a portion of the continuous line passing through any given memory cell 10 serves as its select gate 24. Each row of memory cell pairs can include an erase gate line 26*a* electrically connecting together all the erase gates 26 in the row of memory cell pairs. For example, all the erase gates 26 in each row of memory cell pairs can be formed as a continuous line of conductive material, where a portion of the continuous line passing through any given memory cell pair serves as its erase gate 26. Finally, each row of memory cell pairs can include a source line 14*a* electrically connecting together all the source regions 14 in the row of memory cell pairs. For example, all the source regions 14 in each row of memory cell pairs can be formed as a continuous line of conductive diffusion in the substrate 12, where a portion of the continuous line passing through any given memory cell pair serves as its source region 14.

Various combinations of voltages are applied to the control gate 22, select gate 24, erase gate 26 and source and drain regions 14/16, to program the split gate non-volatile memory cell 10 (i.e., inject electrons onto the floating gate 20), to erase the split gate non-volatile memory cell 10 (i.e., remove electrons from the floating gate 20), and to read the split gate non-volatile memory cell 10 (i.e., measure or detect the conductivity of the channel region 18, by for example measuring or detecting an electrical current (also referred to as a read current or current) through the channel region 18, to determine the program state of the floating gate 20).

Split gate non-volatile memory cell 10 can be operated in a digital manner, where the split gate non-volatile memory cell 10 is set to one of only two possible states: a programmed state and an erased state. The split gate non-volatile memory cell 10 is erased by placing a high positive voltage on the erase gate 26, and optionally a negative voltage on the control gate 22, to induce tunneling of electrons from the floating gate 20 to the erase gate 26 (leaving the floating gate 20 in a more positively charged state—the erased state). Split gate non-volatile memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate 20 in a more negatively charged state—the programmed state).

One technique to program the memory cells 10 is sequential programming, which involves applying the programming voltages as a series of pulses (that may include a sequentially increasing programming voltage, such as control gate voltage), with each pulse of programming voltages injecting more electrons onto the floating gate thus increasing the program state of the memory cell 10 with each pulse, until the desired program state is achieved (i.e., until the desired read current for the desired program state is achieved). With sequential programming, there can be intervening read operations between the programming pulses to determine if the desired program state has been achieved by the last applied programming pulse (in which case programming ceases) or has not been achieved (in which case programming continues with one or more programming pulses). For example, each desired program state can be associated with a target read current Irtarget (i.e., the desired and therefore target read current through the channel region 18 during a read operation that is associated with the desired program state). The higher the program state (i.e., the more electrons on the floating gate), the lower the read current Ir. Therefore, read current Ir will drop after each programming pulse. Once a target read current Irtarget is reached (reflecting the desired program state), programming for that memory cell 10 ceases.

Split gate non-volatile memory cell 10 can be read by placing positive voltages on the select gate 24 (turning on the portion of channel region 18 under the select gate 24 by making it conductive) and drain region 16 (and optionally on the erase gate 26 and the control gate 22), and sensing current flow through the channel region 18. If the floating gate 20 is positively charged (i.e. split gate non-volatile memory cell 10 is erased), the split gate non-volatile memory cell 10 will turn on because the both portions of the channel region 18 are conductive due to the lack of electrons on the floating gate 20, and electrical current will flow from drain region 16 to source region 14 (i.e. the split gate non-volatile memory cell 10 is sensed to be in its erased "1" state based on sensed current flow). If the floating gate 20 is negatively charged (i.e. split gate non-volatile memory cell 10 is programmed), the portion of channel region 18 under the floating gate is turned off (low conductivity), thereby preventing appreciable current flow (i.e., the split gate non-volatile memory cell 10 is sensed to be in its programmed "0" state based on no, or minimal, current flow). Memory cells 10 are considered non-volatile because they maintain their program state even when power is not applied to the semiconductor device. Memory cells 10 can be referred to as split gate non-volatile memory cells because two different gates (floating gate 20 and select gate 24), respectively, directly control the conductivity of two different portions of the channel region 18.

Split gate non-volatile memory cell 10 can alternately be operated in an analog manner where the program state (i.e. the amount of charge, such as the number of electrons, on the floating gate 20) of the split gate-non-volatile memory cell 10 can be incrementally changed anywhere from a fully erased state (minimum number of electrons on the floating gate 20) to a fully programmed state (maximum number of electrons on the floating gate 20), or just a portion of this range. This means the split gate non-volatile memory cell 10 storage is analog, which allows for very precise and individual tuning of each split gate non-volatile memory cell 10 in an array of split gate non-volatile memory cells 10. Alternatively, the split gate non-volatile memory cell 10 could be operated as an MLC (multilevel cell) where it is configured to be programmed to one of many discrete values (such as 16 or 64 different values).

If the same set of program voltages are applied during each pulse in sequential programming, the programming amount drops pulse to pulse, because as the floating gate becomes more negatively charged with each pulse, fewer electrons are injected onto the floating gate if the parameters of the programming pulses (applied voltages, supplied current, duration) remain constant. Therefore, when a memory cell 10 is determined to have not reached its target program state after any given pulse, one or more of the programming parameters can be stepped up (i.e., referred to as a voltage increment) to a higher value in the next pulse, to compensate for the dropping pulse-to-pulse programming amount that would otherwise occur. For example, for the memory cell 10 of FIG. 1, programming parameters that can be stepped up from one programming pulse to the next programming pulse can include increases in one or more of the following: voltage applied to the control gate, voltage applied to the erase gate, voltage applied to the source region, current supplied to the drain region, and duration of the programming pulse.

In order to prevent over-programming during sequential programming, the programming voltage increment between the sequential programming pulses can be relatively small. However, a smaller voltage increment means that more pulses are required to sufficiently program a memory cell without over-programming, especially for the higher program states (as used herein, the more electrons on the floating gate, the higher the program state). In fact, a typical memory cell can require 30, or even more, pulses of program voltages to properly program the memory cell to its desired program state. This is the case because each programming pulse should not incrementally change the program state of the memory cell by more than a target window (i.e., a target range) for the desired program state (otherwise an undesired level of over-programming is likely). The advantage of sequential programming is that the memory cell is incrementally programmed until it quite precisely achieves the desired program state (which will provide the desired read current during a read operation so that the program state can be reliably detected). However, a drawback to sequential programming is that it can take a relatively long time to perform so many programming voltage pulses, separated by multiple read operations (e.g., tens of microseconds).

There is a need for a memory cell programming method that accurately and reliably programs the memory cells, without over-programming the memory cells, in a reduced amount of time.

BRIEF SUMMARY OF THE INVENTION

The aforementioned problems and needs are addressed by a method of programming a memory cell to a target program state that is associated with a control gate nominal read voltage and a target read current. The memory cell comprises a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The method comprising applying a first pulse of programming voltages to the source region, the select gate, the erase gate and the control gate, wherein the first pulse of programming voltages includes a first voltage applied to the control gate, applying a second pulse of programming voltages to the source region, the select gate, the erase gate and the control gate, wherein the second pulse of programming voltages includes a second voltage applied to the control gate, performing a read operation that includes detecting currents through the channel region for different voltages applied to the control gate, determining a first read voltage for the control gate using the detected currents that corresponds to the target read current, determining a target programming voltage using the second voltage, the first read voltage, the control gate nominal read voltage and a tuning factor, erasing the memory cell, applying a third pulse of programming voltages to the source region, the select gate, the erase gate and the control gate, wherein the third pulse of programming voltages includes the first voltage applied to the control gate, and applying a fourth pulse of programming voltages to the source region, the select gate, the erase gate and the control gate, wherein the fourth pulse of programming voltages includes the target programming voltage applied to the control gate.

A method of programming memory cells to a target program state that is associated with a control gate nominal read voltage and a target read current. Each of the memory cells comprises a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The method comprises, for each of the memory cells, applying a first pulse of programming voltages to the source region, the select gate, the erase gate and the control gate, wherein the first pulse of programming voltages includes a first voltage applied to the control gate, applying a second pulse of programming voltages to the source region, the select gate, the erase gate and the control gate, wherein the second pulse of programming voltages includes a second voltage applied to the control gate, performing a read operation that includes detecting currents through the channel region for different voltages applied to the control gate, determining a first read voltage for the control gate using the detected currents that corresponds to the target read current, determining a target programming voltage using the second voltage, the first read voltage, the control gate nominal read voltage and a tuning factor, erasing the memory cell, applying a third pulse of programming voltages to the source region, the select gate, the erase gate and the control gate, wherein the third pulse of programming voltages includes the first voltage applied to the control gate, and applying a fourth pulse of programming voltages to the source region, the select gate, the erase gate and the control gate, wherein the fourth pulse of programming voltages includes the target programming voltage applied to the control gate.

A semiconductor device comprises a memory cell and control circuitry. The memory cell comprises a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The control circuitry to program the memory cell to a target program state that is associated with a control gate nominal read voltage and a target read current, by apply a first pulse of programming voltages to the source region, the select gate, the erase gate and the control gate, wherein the first pulse of programming voltages includes a first voltage applied to the control gate, apply a second pulse of programming voltages to the source region, the select gate, the erase gate and the control gate, wherein the second pulse of programming voltages includes a second voltage applied to the control gate, perform a read operation that includes detection of currents through the channel region for different voltages applied to the control gate, determine a first read voltage for the control gate using the detected currents that corresponds to the target read current, determine a target programming voltage using the second voltage, the first read voltage, the control gate nominal read voltage and a tuning factor, erase the memory cell, apply a third pulse of programming voltages to the source region, the select gate, the erase gate and the control gate, wherein the third pulse of programming voltages includes the first voltage applied to the control gate, and apply a fourth pulse of programming voltages to the source region, the select gate, the erase gate and the control gate, wherein the fourth pulse of programming voltages includes the target programming voltage applied to the control gate.

A semiconductor device comprises a plurality of memory cells and control circuitry. Each of the memory cells comprises a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The control circuitry to program the memory cells to a target program state that is associated with a control gate nominal read voltage and a target read current, by, for each of the memory cells, apply a first pulse of programming voltages to the source region, the select gate, the erase gate and the control gate, wherein the first pulse of programming voltages includes a first voltage applied to the control gate, apply a second pulse of programming voltages to the source region, the select gate, the erase gate and the control gate, wherein the second pulse of programming voltages includes a second voltage applied to the control gate, perform a read operation that includes detection of currents through the channel region for different voltages applied to the control gate, determine a first read voltage for the control gate using the detected currents that corresponds to the target read current, determine a target programming voltage using the second voltage, the first read voltage, the control gate nominal read voltage and a tuning factor, erase the memory cell, apply a third pulse of programming voltages to the source region, the select gate, the erase gate and the control gate, wherein the third pulse of programming voltages includes the first voltage applied to the control gate, and apply a fourth pulse of programming voltages to the source region, the select gate, the erase gate and the control gate, wherein the fourth pulse of programming voltages includes the target programming voltage applied to the control gate.

Other objects and features of the present disclosure will become apparent by a review of the specification, claims and appended figures.

DETAILED DESCRIPTION OF THE INVENTION

Figure 1:
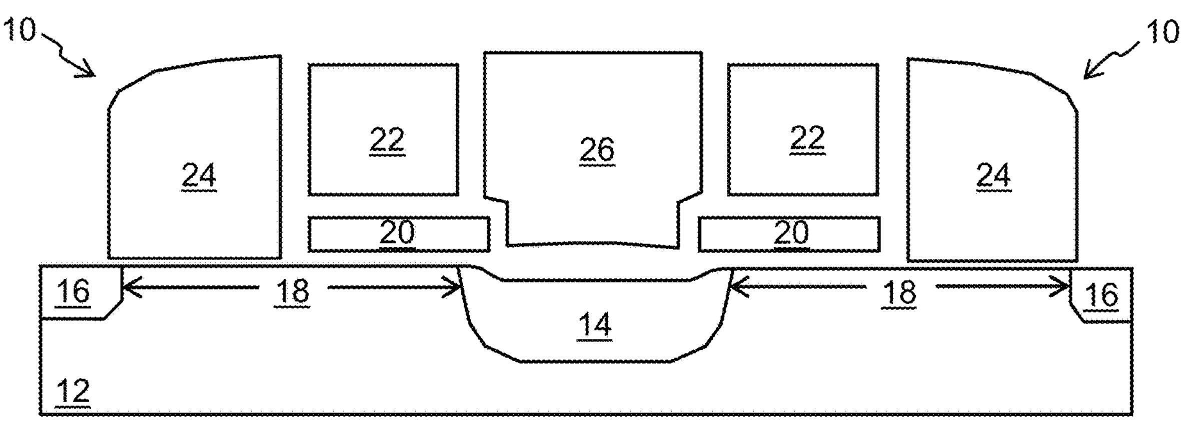
FIG. 1 is a cross sectional view of a conventional pair of memory cells.
Figure 2:
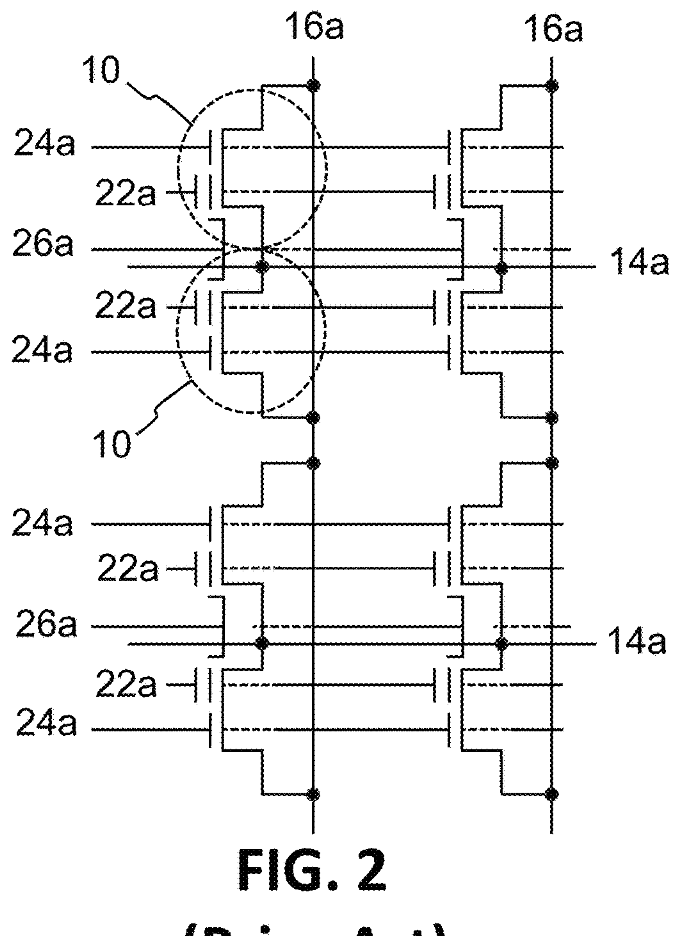
FIG. 2 is a schematic and layout diagram of a conventional memory cell array of the memory cells of FIG. 1.
Figure 3:
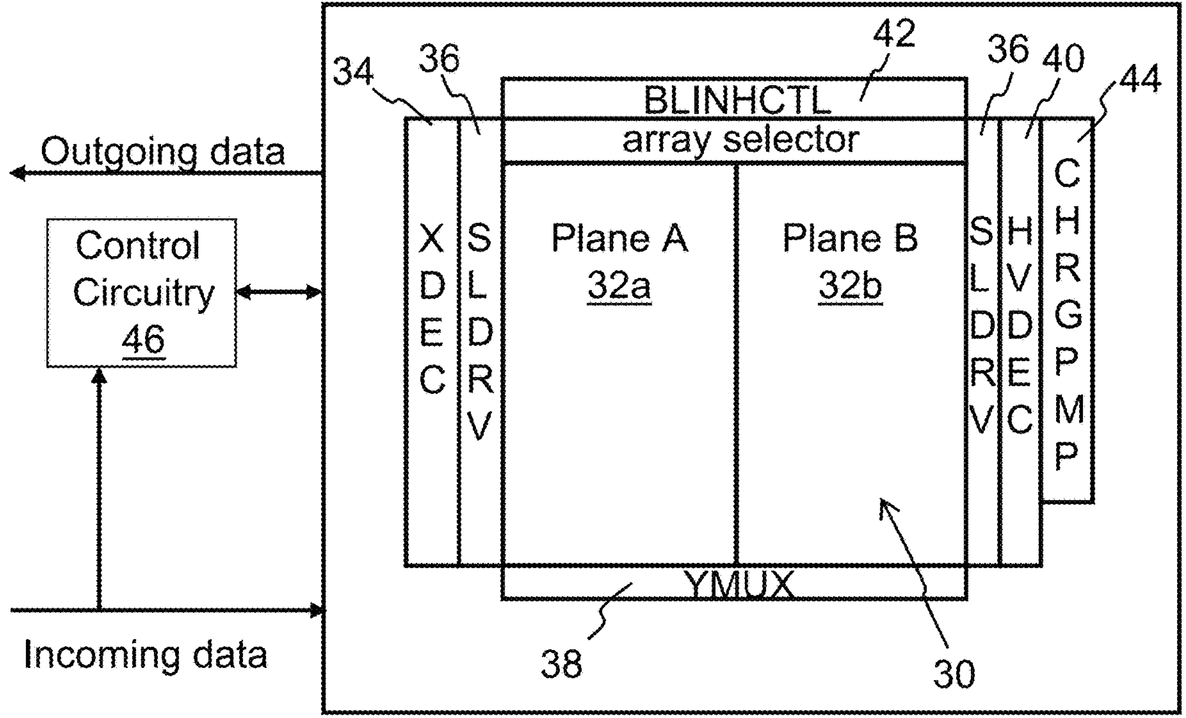
FIG. 3 is a diagram illustrating components of a semiconductor device.

The present examples illustrate memory cell programing methods that can be implemented as part of control circuitry 46, which controls the various device elements for a memory array, which can be better understood from the architecture of an example semiconductor device as illustrated in FIG. 3. The semiconductor device includes an array 30 of the split gate memory cells 10, which can be segregated into two separate planes (Plane A 32*a* and Plane B 32*b*). The split gate memory cells 10 can be of the type shown in FIG. 1, arranged in a plurality of rows and columns in the semiconductor substrate 12 as illustrated in FIG. 2, and thus formed on a single chip. Adjacent to the array 30 of split gate memory cells 10 are an address decoder 34 (e.g., XDEC), source line drivers 36 (e.g., SLDRV), a column decoder 38 (e.g., YMUX), a high voltage row decoder 40 (e.g., HVDEC), a bit line controller 42 (e.g., BLINHCTL), and a charge pump 44 (e.g., CHRGPMP), which are used to decode addresses and supply the various voltages to the various gates and regions of the split gate memory cells 10 during read, program, and erase operations for selected split gate memory cells 10 of the array 30, under the control of the control circuitry 46. Column decoder 38 includes a sense amplifier containing circuitry for measuring the currents on the bit lines during a read operation. Control circuitry 46 controls the various device elements to implement each operation (program, erase, read) on selected split gate memory cells 10 of the array 30 as described herein. Control circuitry 46 operates the semiconductor device to program, erase and read the selected split gate memory cells 10 of the array 30. As part of these operations, the control circuitry 46 can be provided with access to incoming data which is user data to be programmed to the selected split gate memory cells 10 of the array 30, along with program, erase and read commands provided on the same or different lines. Data read from the array 30 (i.e., from selected split gate memory cells 10 of the array 30) is provided as outgoing data.

The programming method involves the control circuitry 46 implementing memory cell programming. Thus, control circuitry 46 may be loaded with software, i.e. non-transitory electronically readable instructions, or firmware, or can consist of respective circuits, or any combination thereof, to perform the methods described herein. Control circuitry 46 may be implemented by a microcontroller, dedicated circuitry, a processor, a general purpose processor running firmware or software, or a combination thereof.

Figure 4:
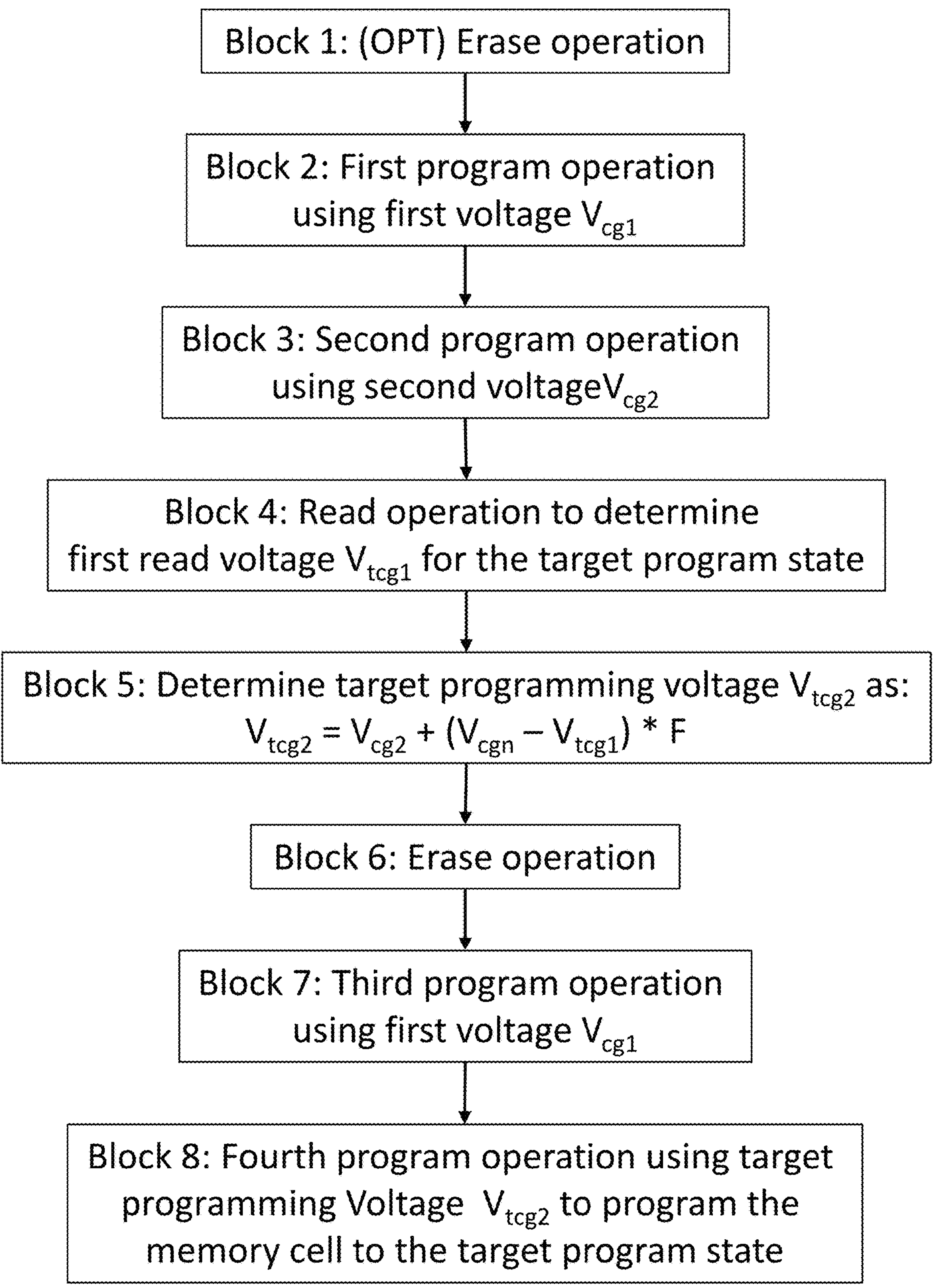
FIG. 4 is a diagram illustrating a process flow for a programming method.

The programming method is shown in FIG. 4, and is described with respect to a single memory cell being programmed to a target program state, but it should be understood the method applies to programming an array of memory cells to different target program states. The method begins with the memory cell in its erased state, which if the memory cell was previously programmed, can involve an optional erase operation (Block 1). At Block 2, a first program operation is performed by applying a first pulse of programming voltages to the memory cell, where the voltage applied to the control gate 22 during the first pulse is a first voltage $V_{cg1}$. The voltage applied to the control gate 22 is important because the capacitive coupling of this voltage to the floating gate 20 is a key parameter that dictates the amount of programming that occurs during the programming pulse. The first pulse of programming voltages programs the memory cell to a first program state (e.g., can be referred to as a pre-programmed state) which is below the target program state. At Block 3, a second program operation is performed by applying a second pulse of programming voltages to the memory cell, where the voltage applied to the control gate 22 during the second pulse is a second voltage $V_{cg2}$, where second voltage $V_{cg2}$ is greater than first voltage $V_{cg1}$. The second pulse of programming voltages programs the memory cell to a second program state that is higher than the first program state.

At Block 4, a sweeping read operation is performed in which nominal read voltages are applied to the memory cell except for the read voltage on the control gate 22, which is swept over a range of different voltages as the read current through the channel region 18 is measured or detected. The purpose of this read operation is to determine, for the second program state, a first read voltage $V_{tcg1}$ on the control gate 22 that produces a target read current $I_t$ through the channel region 18. The target read current $I_t$ is the current through the channel region 18 that corresponds to the target program state during a normal read operation (i.e., once the memory cell is programmed to the target program state, a normal read operation applying nominal read voltages will result in target read current $I_t$ through the channel region 18).

At Block 5, a target programming voltage $V_{tcg2}$ is determined according to:

$$V_{tcg2}=V_{cg2}+(V_{cgn}-V_{tcg1})*F \qquad \text{Equation 1}$$

where $V_{cg2}$ is the second voltage used in the second program operation of Block 3, $V_{tcg1}$ is the first read voltage determined by the read operation of Block 4, $V_{cgn}$ is the control gate nominal read voltage for the control gate 22 that is used to read the program state of the memory cell during normal read operations, and F is a tuning factor (discussed in more detail below). A non-limiting example of control gate nominal read voltage $V_{cgn}$ is 2.5 V. The determined target programming voltage $V_{tcg2}$ can be saved internally in or externally to the semiconductor device for future program operations involving the memory cell and the target program state. Blocks 1-5 may be performed once for each of the possible target program states for the memory cell, as further explained below.

At Block 6, an erase operation is used to erase the memory cell. At Block 7, a third program operation is performed by applying a third pulse of programming voltages to the memory cell, where the voltage applied to the control gate 22 during the third pulse is the first voltage $V_{cg1}$. The third pulse of programming voltages programs the memory cell to the first program state (as before, e.g., a pre-programmed state). At Block 8, a fourth program operation is performed by applying a fourth pulse of programming voltages to the memory cell, where the voltage applied to the control gate 22 during the fourth pulse is the target programming voltage $V_{tcg2}$. The fourth pulse of programming voltages programs the memory cell to the target program state. It has been discovered by the present inventors that there is a high likelihood that the combination of the third and fourth pulses of programming voltages will place the memory cell in the desired target program state. An optional read verify operation can be performed to verify the desired target program state was achieved, but the high likelihood of achieving the desired target program state means that a read verify operation may not be necessary.

The present inventors have discovered that including tuning factor F in Equation 1 improves the accuracy of programming the memory cell to the target program state. For most semiconductor devices, tuning factor F has been found to be a number slightly higher than 1. A non-limiting example of tuning factor F can be 1.15, and can be determined experimentally and/or empirically by analyzing program accuracy of Blocks 1-8 using different values of tuning factor F. Tuning factor F can also be determined by minimizing a cell-by-cell correlation of the first read voltage $V_{tcg1}$ after the second and fourth program operations. The present inventors have determined that tuning factor F is reproducible over time for mature process technologies, and may not need any periodic tuning.

Once the target programming voltage $V_{tcg2}$ is determined for a particular memory cell and target program state, it can be re-used repeatedly for any subsequent programming of that memory cell to that target program state. This means for any given memory cell and target program state, Blocks 1-5 may be performed only once to determine the target programming voltage $V_{tcg2}$, which can be saved for later use. Thereafter, the memory cell can be programmed to the target program state by performing Blocks 6-8 using the saved target programming voltage $V_{tcg2}$ (i.e., Blocks 1-5 need not be repeated each time the memory cell programmed), thus reducing the time needed to program the memory cell to the target program state.

Program efficiency can be achieved by performing Blocks 1-5 in advance of normal user operation for each possible target program state of the memory cell, and doing so for each memory cell, storing the determined target programming voltages $V_{tcg2}$ for later programming. For example, if each memory cell has four possible target program states (one of which is the erased state and one is a deeply programmed state), then Blocks 1-5 can be performed on each memory cell twice, to determine (and store) two target programming voltages $V_{tcg2}$ for the two middle program states for that memory cell. Then, during normal operation, anytime a memory cell is to be programmed to a particular target program state, Blocks 6-8 are performed using the corresponding target programming voltage $V_{tcg2}$ (retrieved from storage) for that memory cell and that particular target program state. For example, after a memory cell is programmed to a target program state and later erased, it can be programmed again to the target program state using the corresponding target programming voltage $V_{tcg2}$ (retrieved from storage) for that memory cell and that particular target program state.

Figure 5:
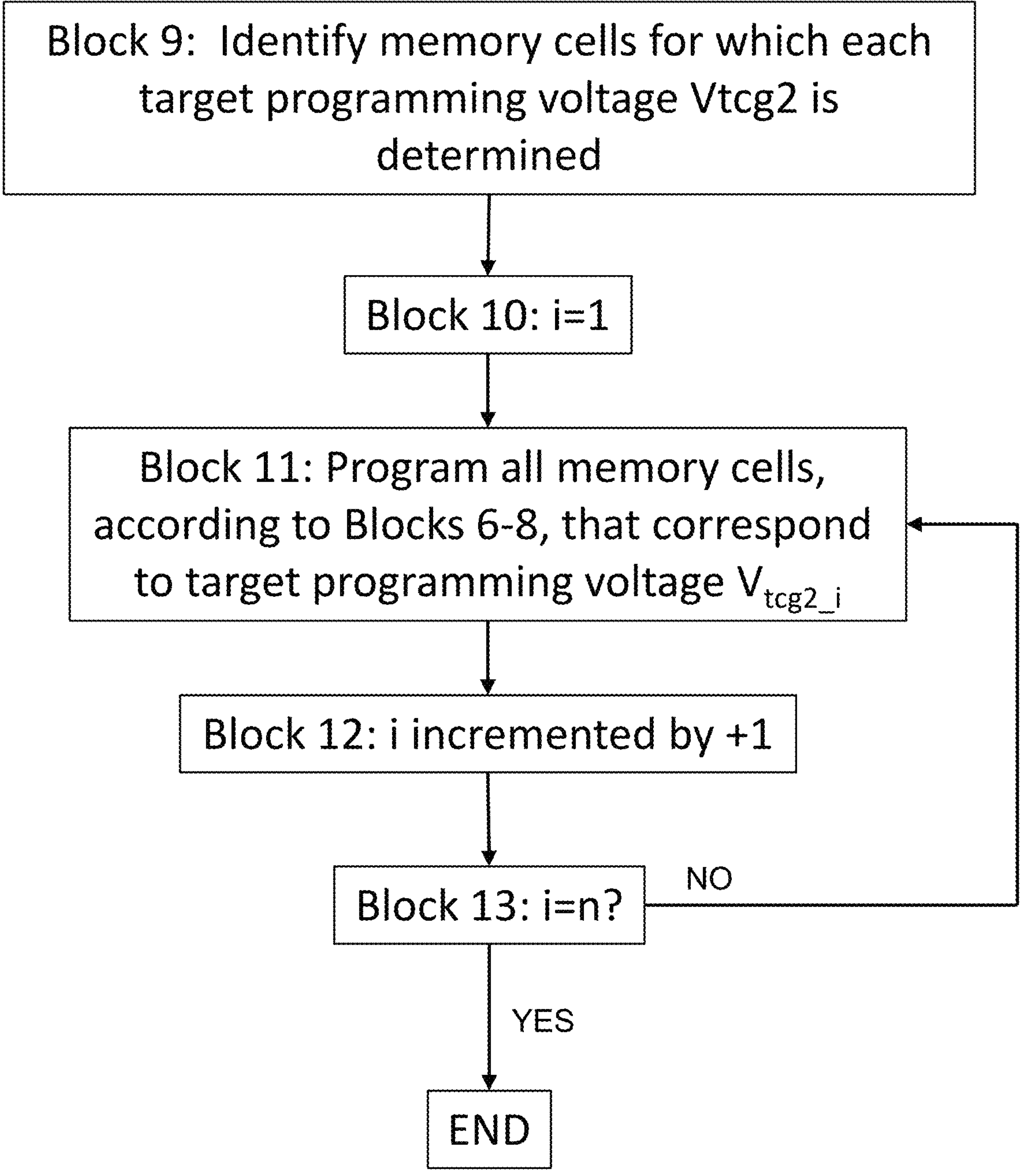
FIG. 5 is a diagram illustrating a process flow for a programming method.

FIG. 5 illustrates an example process flow for performing Blocks 6-8 (i.e., after all the possible target programming voltages $V_{tcg2}$ have been determined for all the possible target program states and all the memory cells) to program incoming data into the memory cells, where the order in which the memory cells are programmed is dictated by the target programming voltages $V_{tcg2}$ (e.g., lowest to highest). For example, for a semiconductor device where performing Blocks 1-5 results in n different possible target programming voltages $V_{tcg2}$, the lowest being $V_{tcg2\_1}$, and the highest being $V_{tcg2\_n}$, the process begins with, for each of the target programming voltages $V_{tcg2}$, identifying the plurality of memory cells for which each of the target programming voltages $V_{tcg2}$ is determined (Block 9 of FIG. 5). The process can proceed first with the lowest target programming voltage $V_{tcg2\_i}$ where i=1 (see Block 10 of FIG. 5). In Block 11, all memory cells being programmed with incoming data, where the memory cells and the target program states correspond to a determined target programming voltages $V_{tcg2\_1}$, are programmed first with their respective data. In Block 12, i is incremented by 1. In Block 13, if i<n is no, then the process returns to Block 11, otherwise the process ends. The process repeats until the memory cells to be programed with the highest target programming voltage $V_{tcg2\_n}$ are programmed, then the process ends. Sequencing the order of programming in this manner (starting with the lowest target programming voltage $V_{tcg2}$, and programming all the memory cells together having the same target programming voltage $V_{tcg2}$ before moving to the next highest target programming voltage $V_{tcg2}$ can speed programming of the memory array, with higher accuracy and lower cell to cell interference.

The above method has several advantages. First, as opposed to widely used conventional "program-read verify" cycle algorithm characterized by continual switching between sequential programming steps and read-verify operations until the memory cell hits a target program state, new method allows for the reduction of total programming time and energy/power consumption caused by switching between program and read operations as conventionally done. Second, to avoid over-programming for all memory cells with different programming efficiency in conventional incremental sequential programming, the initial minimum control gate voltage can be set low with sufficient margin. In the new method, the target programming voltage $V_{tcg2}$ values for all memory cells are predetermined, so, there is no need to start programming with the target programming voltage $V_{tcg2}$ lower than the predetermined minimum. This further reduces total programming time and program disturb stress on adjacent memory cells. Finally, performing Blocks 1-5 in advance for all memory cells and their respective possible target program states, and saving the determined target programming voltages $V_{tcg2}$ for later use when incoming data is to be stored, allows the saved target programming voltages $V_{tcg2}$ to be used to program the memory cells during normal use with only two program operations (i.e., as few as two program pulses to program incoming data into each memory cell).

It is to be understood that the present disclosure is not limited to the example(s) described above and illustrated herein, but encompasses any and all variations falling within the scope of any claims. For example, references to the present disclosure or invention or examples herein are not intended to limit the scope of any claim or claim term, but instead merely make reference to one or more features that may be covered by one or more claims. Materials, processes and numerical examples described above are exemplary only, and should not be deemed to limit the claims. Finally, the claims are comprising claims unless otherwise stated, and therefore "each" of a plurality of elements having a limitation does not preclude the inclusion of additional such elements lacking the limitation unless otherwise specifically claimed. It should be noted that reference herein to circuitry, or a module of circuitry, or the like, to perform or configured to perform an operation refers to the physical structure of the circuit (i.e., the capabilities of the circuitry as dictated by its structure), and does not refer to any method or actual use of the circuitry.

What is claimed is:

1. A method of programming a memory cell to a target program state that is associated with a control gate nominal read voltage and a target read current, the memory cell comprising:

a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate;

the method comprising:

applying a first pulse of programming voltages to the source region, the select gate, the erase gate and the control gate, wherein the first pulse of programming voltages includes a first voltage applied to the control gate, applying a second pulse of programming voltages to the source region, the select gate, the erase gate and the control gate, wherein the second pulse of programming voltages includes a second voltage applied to the control gate, performing a read operation that includes detecting currents through the channel region for different voltages applied to the control gate, determining a first read voltage for the control gate using the detected currents that corresponds to the target read current, determining a target programming voltage using the second voltage, the first read voltage, the control gate nominal read voltage and a tuning factor, erasing the memory cell, applying a third pulse of programming voltages to the source region, the select gate, the erase gate and the control gate, wherein the third pulse of programming voltages includes the first voltage applied to the control gate, and applying a fourth pulse of programming voltages to the source region, the select gate, the erase gate and the control gate, wherein the fourth pulse of programming voltages includes the target programming voltage applied to the control gate.

2. The method of claim 1, wherein the second voltage is greater than the first voltage.

3. The method of claim 1, wherein the determination of the target programming voltage is performed according to: the second voltage+(the control gate nominal read voltage−the first read voltage)*the tuning factor.

4. The method of claim 1, further comprising:

erasing the memory cell before the application of the first pulse of programming voltages.

5. The method of claim 1, further comprising:

erasing the memory cell after the application of the fourth pulse of programming voltages, and then:

applying a fifth pulse of programming voltages to the source region, the select gate, the erase gate and the control gate, wherein the fifth pulse of programming voltages includes the first voltage applied to the control gate, and applying a sixth pulse of programming voltages to the source region, the select gate, the erase gate and the control gate, wherein the sixth pulse of programming voltages includes the target programming voltage applied to the control gate.

6. A method of programming memory cells to a target program state that is associated with a control gate nominal read voltage and a target read current, where each of the memory cells comprises:

a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate;

the method comprising, for each of the memory cells:

applying a first pulse of programming voltages to the source region, the select gate, the erase gate and the control gate, wherein the first pulse of programming voltages includes a first voltage applied to the control gate, applying a second pulse of programming voltages to the source region, the select gate, the erase gate and the control gate, wherein the second pulse of programming voltages includes a second voltage applied to the control gate, performing a read operation that includes detecting currents through the channel region for different voltages applied to the control gate, determining a first read voltage for the control gate using the detected currents that corresponds to the target read current, determining a target programming voltage using the second voltage, the first read voltage, the control gate nominal read voltage and a tuning factor, erasing the memory cell, applying a third pulse of programming voltages to the source region, the select gate, the erase gate and the control gate, wherein the third pulse of programming voltages includes the first voltage applied to the control gate, and applying a fourth pulse of programming voltages to the source region, the select gate, the erase gate and the control gate, wherein the fourth pulse of programming voltages includes the target programming voltage applied to the control gate.

7. The method of claim 6, wherein the second voltage is greater than the first voltage.

8. The method of claim 6, comprising:

identifying a first plurality of the memory cells for which a first value of the target programming voltage is determined, and identifying a second plurality of the memory cells for which a second value of the target programming voltage is determined, wherein the first value is different than the second value, wherein the application of the third and fourth pulses of programming voltages for the first plurality of the memory cells is performed before the application of the third and fourth pulses of programming voltages for the second plurality of the memory cells.

9. The method of claim 6, wherein for each of the memory cells, the determination of the target programming voltage is performed according to: the second voltage+(the control gate nominal read voltage−the first read voltage)*the tuning factor.

10. The method of claim 6, wherein for each of the memory cells, further comprising:

erasing the memory cell before the application of the first pulse of programming voltages.

11. The method of claim 6, wherein for each of the memory cells, further comprising:

erasing the memory cell after the application of the fourth pulse of programming voltages, and then:

applying a fifth pulse of programming voltages to the source region, the select gate, the erase gate and the control gate, wherein the fifth pulse of programming voltages includes the first voltage applied to the control gate, and applying a sixth pulse of programming voltages to the source region, the select gate, the erase gate and the control gate, wherein the sixth pulse of programming voltages includes the target programming voltage applied to the control gate.

12. A semiconductor device, comprising:

a memory cell comprising:

a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate; and control circuitry to program the memory cell to a target program state that is associated with a control gate nominal read voltage and a target read current, by:

apply a first pulse of programming voltages to the source region, the select gate, the erase gate and the control gate, wherein the first pulse of programming voltages includes a first voltage applied to the control gate, apply a second pulse of programming voltages to the source region, the select gate, the erase gate and the control gate, wherein the second pulse of programming voltages includes a second voltage applied to the control gate, perform a read operation that includes detection of currents through the channel region for different voltages applied to the control gate, determine a first read voltage for the control gate using the detected currents that corresponds to the target read current, determine a target programming voltage using the second voltage, the first read voltage, the control gate nominal read voltage and a tuning factor, erase the memory cell, apply a third pulse of programming voltages to the source region, the select gate, the erase gate and the control gate, wherein the third pulse of programming voltages includes the first voltage applied to the control gate, and apply a fourth pulse of programming voltages to the source region, the select gate, the erase gate and the control gate, wherein the fourth pulse of programming voltages includes the target programming voltage applied to the control gate.

13. The semiconductor device of claim 12, wherein the second voltage is greater than the first voltage.

14. The semiconductor device of claim 12, wherein the determination of the target programming voltage is according to: the second voltage+(the control gate nominal read voltage−the first read voltage)*the tuning factor.

15. The semiconductor device of claim 12, wherein the control circuitry to:

erase the memory cell before the application of the first pulse of programming voltages.

16. The semiconductor device of claim 12, wherein the control circuitry to:

erase the memory cell after the application of the fourth pulse of programming voltages, and then:

apply a fifth pulse of programming voltages to the source region, the select gate, the erase gate and the control gate, wherein the fifth pulse of programming voltages includes the first voltage applied to the control gate, and apply a sixth pulse of programming voltages to the source region, the select gate, the erase gate and the control gate, wherein the sixth pulse of programming voltages includes the target programming voltage applied to the control gate.

17. A semiconductor device, comprising:

a plurality of memory cells, wherein each of the memory cells comprises:

a source region and a drain region formed in a semiconductor substrate, with a channel region of the semiconductor substrate extending between the source region and the drain region, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate; and control circuitry to program the memory cells to a target program state that is associated with a control gate nominal read voltage and a target read current, by, for each of the memory cells:

apply a first pulse of programming voltages to the source region, the select gate, the erase gate and the control gate, wherein the first pulse of programming voltages includes a first voltage applied to the control gate, apply a second pulse of programming voltages to the source region, the select gate, the erase gate and the control gate, wherein the second pulse of programming voltages includes a second voltage applied to the control gate, perform a read operation that includes detection of currents through the channel region for different voltages applied to the control gate, determine a first read voltage for the control gate using the detected currents that corresponds to the target read current, determine a target programming voltage using the second voltage, the first read voltage, the control gate nominal read voltage and a tuning factor, erase the memory cell, apply a third pulse of programming voltages to the source region, the select gate, the erase gate and the control gate, wherein the third pulse of programming voltages includes the first voltage applied to the control gate, and apply a fourth pulse of programming voltages to the source region, the select gate, the erase gate and the control gate, wherein the fourth pulse of programming voltages includes the target programming voltage applied to the control gate.

18. The semiconductor device of claim 17, wherein the second voltage is greater than the first voltage.

19. The semiconductor device of claim 17, wherein the control circuitry to:

identify a first plurality of the memory cells for which a first value of the target programming voltage is determined, and identify a second plurality of the memory cells for which a second value of the target programming voltage is determined, wherein the first value is different than the second value, wherein the application of the third and fourth pulses of programming voltages for the first plurality of the memory cells is performed before the application of the third and fourth pulses of programming voltages for the second plurality of the memory cells.

20. The semiconductor device of claim 17, wherein for each of the memory cells, the determination of the target programming voltage is according to: the second voltage+(the control gate nominal read voltage−the first read voltage)*the tuning factor.

21. The semiconductor device of claim 17, wherein the control circuitry to, for each of the memory cells:

erase the memory cell before the application of the first pulse of programming voltages.

22. The semiconductor device of claim 17, wherein the control circuitry to, for each of the memory cells:

erase the memory cell after the application of the fourth pulse of programming voltages, and then:

apply a fifth pulse of programming voltages to the source region, the select gate, the erase gate and the control gate, wherein the fifth pulse of programming voltages includes the first voltage applied to the control gate, and apply a sixth pulse of programming voltages to the source region, the select gate, the erase gate and the control gate, wherein the sixth pulse of programming voltages includes the target programming voltage applied to the control gate.

* * * * *